(12) United States Patent
Neravetla et al.

(10) Patent No.: US 6,861,881 B1
(45) Date of Patent: Mar. 1, 2005

(54) FRACTIONAL CLOCK DIVIDER USING DIGITAL TECHNIQUES

(75) Inventors: Karthik R. Neravetla, San Jose, CA (US); Annie Wang, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/674,874

(22) Filed: Sep. 29, 2003

(51) Int. Cl.[7] .............................................. H03K 21/00
(52) U.S. Cl. ........................ 327/115; 327/117; 377/48
(58) Field of Search ................................ 327/115, 117; 377/47, 48

(56) References Cited

U.S. PATENT DOCUMENTS 5,249,214 A * 9/1993 Ulmer et al. ............... 377/121
5,384,816 A * 1/1995 Prysby et al. ................. 377/48
6,489,817 B1   12/2002 Wong et al.

* cited by examiner

Primary Examiner—Kenneth B. Wells
(74) Attorney, Agent, or Firm—Darby & Darby P.C.; Matthew M. Gaffney

(57) ABSTRACT

A fractional clock divider system and method is provided. The clock divider is configured to provide an output clock signal in response to an input clock signal. The frequency of the output clock signal may be an integral or fractional division of the input clock signal. The output frequency is equal to: (ref_freq*2)/mul, where ref_freq is the frequency of the input clock signal, and mul is a selected integer that is greater than one. The positive and negative edges of the input clock are counted to provide a positive count and a negative count respectively. A table is configured to store preselected reference values. A logic circuit is configured to control the output clock signal such that an appropriate clock transition occurs in the output clock signal when the positive and negative count reach the corresponding preselected reference values.

20 Claims, 7 Drawing Sheets

| MUL (IN HEX) | POINT B | | POINT C | | POINT D | |
|---|---|---|---|---|---|---|
| | REFHLP1 | REFHLN1 | REFHLP | REFHLN | REFHLP2 | REFHLN2 |
| 2 | 1 | 1 | 2 | 1 | 2 | 2 |
| 3 | 2 | 1 | 2 | 2 | 3 | 3 |
| 4 | 2 | 1 | 3 | 2 | 4 | 3 |
| 5 | 2 | 2 | 3 | 3 | 5 | 4 |
| 6 | 2 | 2 | 4 | 3 | 5 | 5 |
| 7 | 3 | 2 | 4 | 4 | 6 | 6 |
| 8 | 3 | 2 | 5 | 4 | 7 | 6 |
| 9 | 3 | 3 | 5 | 5 | 8 | 7 |
| A | 3 | 3 | 6 | 5 | 8 | 8 |
| B | 4 | 3 | 6 | 6 | 9 | 9 |
| C | 4 | 3 | 7 | 6 | A | 9 |
| D | 4 | 4 | 7 | 7 | B | A |

*Fig. 3.*

FRACTIONAL CLOCK DIVIDER USING DIGITAL TECHNIQUES

FIELD OF THE INVENTION

The present invention relates to clock division, and, in particular, to a method of clock division that provides an output clock signal having a clock period that is an; integral or fractional multiple of the reference clock period.

BACKGROUND OF THE INVENTION

A clock divider is arranged to provide an output clock signal in response to a reference clock signal. The clock divider is configured to use digital techniques to divide the reference clock frequency by an integer value. For example, a typical clock divider may be configured to generate a 7.5 MHz clock signal by dividing a 60 MHz reference clock signal by 8.

BRIEF DESCRIPTION OF THE DRAWINGS

Non-limiting and non-exhaustive embodiments of the present invention are described with reference to the following drawings.

FIG. 3 is a tabular illustration of example reference values for an example ROM table.

DETAILED DESCRIPTION OF THE PREFERRED EMBODIMENT

Figure 1:
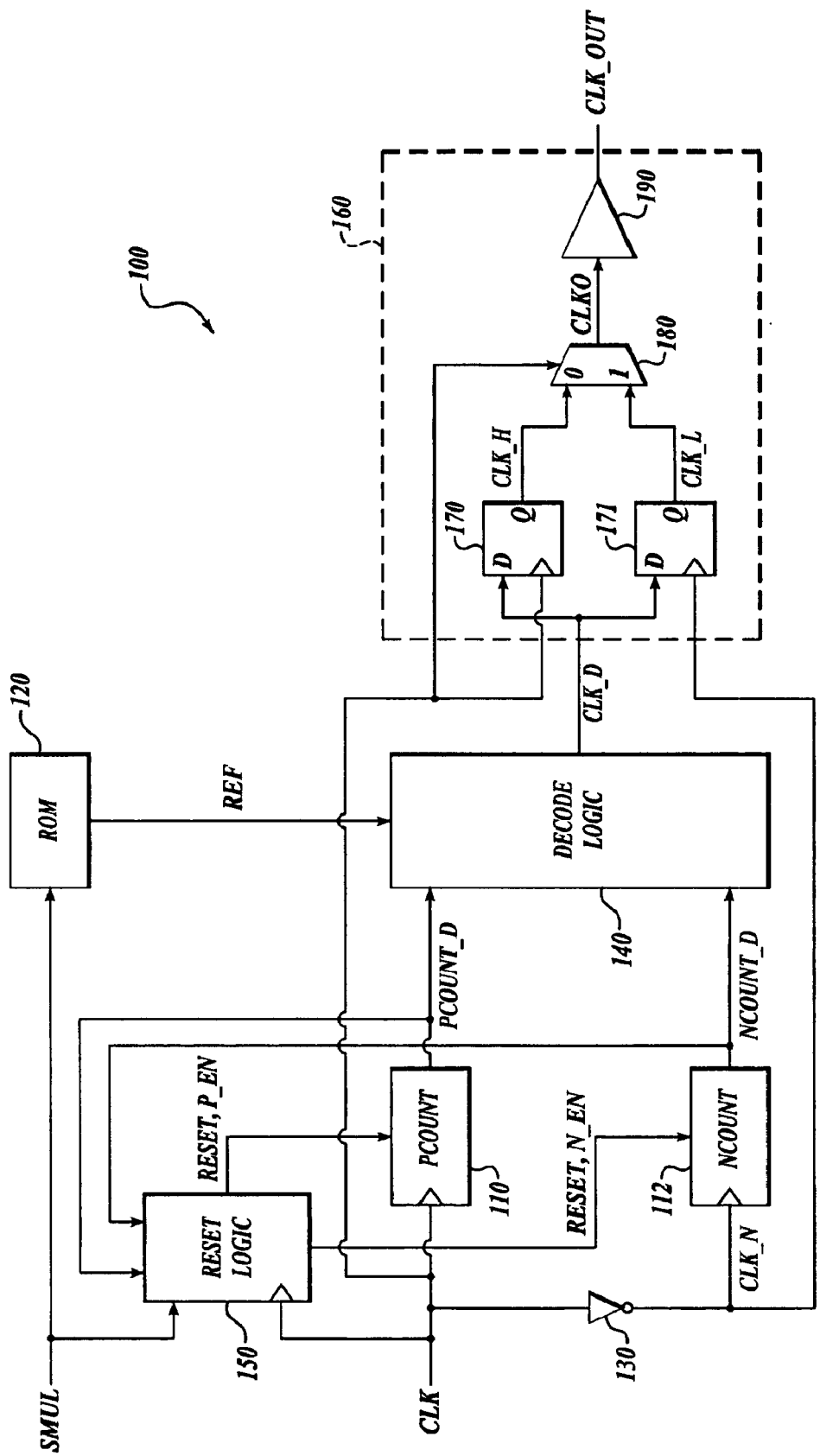
FIG. 1 is an illustration of an example embodiment of a fractional clock divider system.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a fractional clock divider system and method. The clock divider is configured to provide an output clock signal in response to an input clock signal. The frequency of the output clock signal may be an integral or fractional division of the input clock signal. The output frequency is equal to: (ref_freq*2)/mul, where ref_freq is the frequency of the input clock signal, and mul is a selected integer that is greater than one. The positive and negative edges of the input clock are counted to provide a positive count and a negative count respectively. A table is configured to store preselected reference values. A logic circuit is configured to control the output clock signal such that an appropriate clock transition occurs in the output clock signal when the positive and negative count reach the corresponding preselected reference values.

FIG. 1 is an illustration of an example embodiment of a fractional clock divider system (100) that is arranged in accordance with aspects of the present invention. System 100 includes a first counter block (110), a second counter block (112), a ROM block (120), an inverter circuit (130), a decode logic block (140), a reset logic block (150), and a jitter minimizing block (160). An example jitter minimizing block (160) comprises flip-flops (170, 171), a multiplexer (180), and a buffer (190).

System 100 is configured to operate as follows below. Counter block 110 is configured to count positive edges of an input clock signal (CLK), and to provide a positive edge count signal (pcount_d). Counter block 110 is also responsive to a reset signal (reset) and a positive edge counter enable signal (p_en). Inverter circuit 130 is configured to invert signal CLK to provide an inverted clock signal (CLK_N). Counter block 112 is configured to count negative edges of signal CLK, and to provide a negative edge count signal (ncount_d). Counter block 112 is also responsive to the reset signal (rst) and a negative edge counter enable signal (n_en).

Reset logic block 150 is configured to provide signals rst, p_en, and n_en in response to signal CLK, signal pcount_d, signal ncount_d, and a mul signal (smul). Signal smul is a digital signal having a value that corresponds to a selected integer (mul). Reset logic block 150 is configured to control counter block 110 such that pcount_d is reset (e.g. to 1) when the next positive edge of CLK occurs after pcount_d reaches pmax (e.g. mul). Reset logic block 150 is further configured to control counter block 112 such that ncount_d is reset (e.g. to 1) when the next negative edge of CLK occurs after ncount_d reaches nmax (e.g. mul). Reset logic block 150 is further configured to assert signal rst for several cycles of CLK to reset counter blocks 110 and 112 when mul is changed. Reset logic block 150 is further configured to assert signal p_en to enable counter block 110 to resume counting when signal rst is deasserted. Reset logic block 150 is further configured to assert signal n_en to enable counter block 112 to resume counting when the next negative edge of CLK occurs after counter block 110 is enabled. Reset logic block 150 is configured to enable counter block 110 before counter block 112 such that pcount_d is never less than ncount_d before pcount_d and ncount_d reach mul.

ROM block 120 is configured to store a set of preselected reference values (ref) for each value of mul. ROM block 120 is configured to provide the set of reference values (ref) that are associated with mul. Optionally, ROM block 120 may be responsive to signal CLK and a read enable signal (Read). Although FIG. 1 shows that the set of reference values (ref) are stored and provided by ROM block 120, an alternative block may be used to store and provide the set of reference values (ref). For example, the set of reference values (ref) may be stored and provided by a lookup table or a wired logic circuit.

Decode logic block 140 is configured to provide a divided clock signal (CLK_D) in response to signals pcount_d, ncount_d, and the set of preselected reference values (ref). The frequency of signal CLK_D is approximately equal to ref_freq*2/mul, where ref_freq is the frequency of signal CLK.

In one example of a fractional clock divider system (100), signal CLK_D is the output clock signal, and jitter reduction block 160 is omitted from the fractional clock divider system (100). Another example of a fractional clock divider system (100) comprises jitter reduction block 160. Jitter reduction block 160 is configured to reduce the jitter associated with signal CLK_D to provide an output clock signal (CLK_OUT). Jitter reduction block 160 is further configured to filter out the effects of toggling inputs on the output clock signal (CLK_OUT).

Flip-flop 170 is configured to provide signal CLK_H in response to signal CLK_D. Flip-flop 170 is triggered on the rising edge of signal CLK. Flip-flop 171 is configured to provide signal CLK_L in response to signal CLK_D. Flip-flop 171 is triggered on the falling edge of signal CLK. Multiplexer 180 is configured to provide signal CLKO in response to signals CLK_H, CLK_L, and CLK. Multiplexer 180 is configured such that signal CLKO corresponds to signal CLK_H when the input clock (CLK) corresponds to a first logic level. Multiplexer 180 is further configured such that signal CLKO corresponds to signal CLK_L when the input clock (CLK) corresponds to a second logic level. According to one example, the first logic level corresponds to logic 0, and the second logic level corresponds to logic 1. Buffer 190 is configured to buffer signal CLKO to provide the output clock signal (CLK_OUT).

Figure 2A:
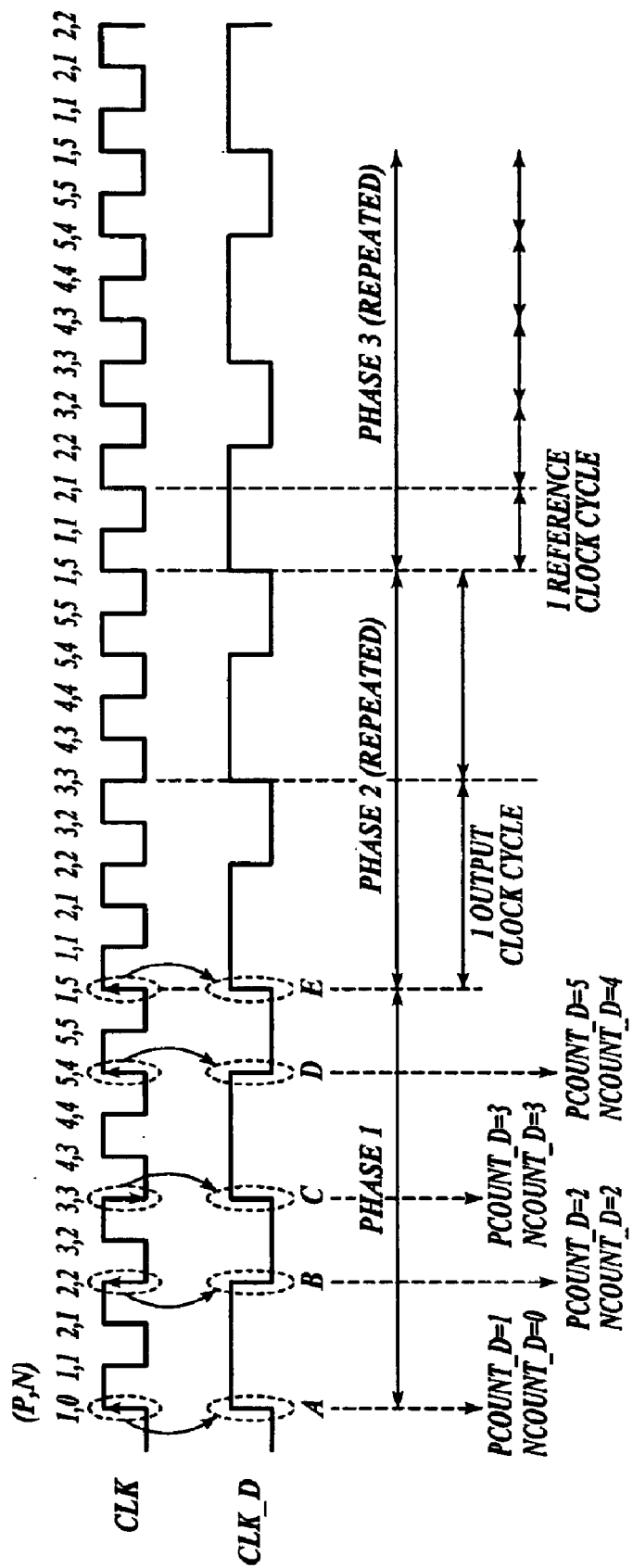
FIG. 2A is graphical illustration of a timing diagram for an example embodiment of a fractional clock divider system for the case when mul=5.
Figure 2B:
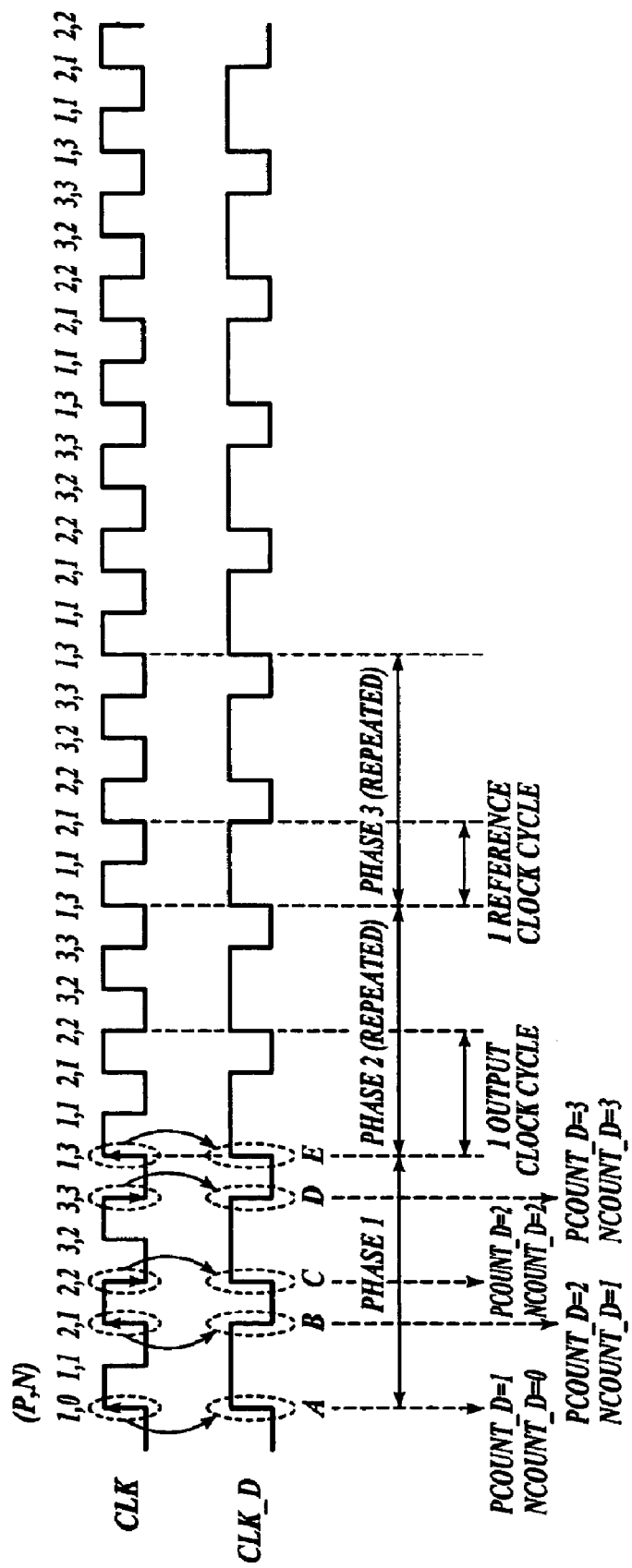
FIG. 2B is graphical illustration of a timing diagram for an example embodiment of a fractional clock divider system for the case when mul=3.
Figure 2C:
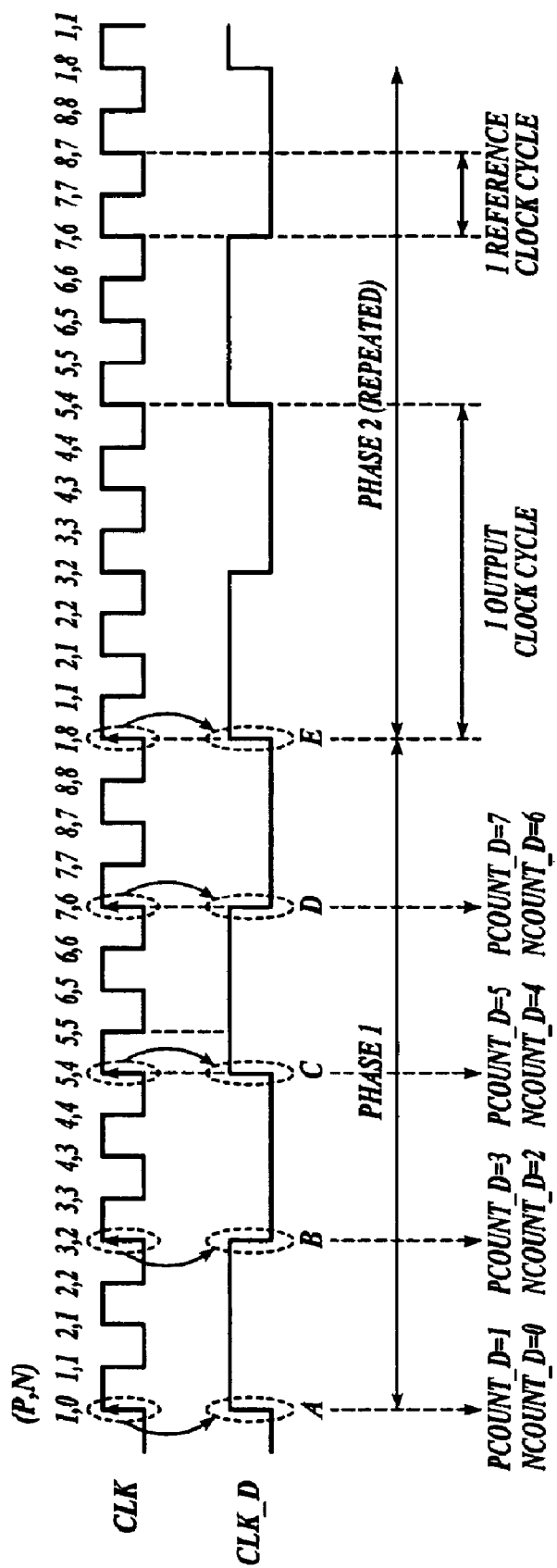
FIG. 2C is graphical illustration of a timing diagram for an example embodiment of a fractional clock divider system for the case when mul=8.

FIG. 2A is graphical illustration of a timing diagram for an example embodiment of a fractional clock divider system for the case when mul=5, according to aspects of the present invention. FIG. 2B is graphical illustration of a timing diagram for an example embodiment of a fractional clock divider system for the case when mul=3, according to aspects of the present invention. FIG. 2C is graphical illustration of a timing diagram for an example embodiment of a fractional clock divider system for the case when mul=8, according to aspects of the present invention.

FIG. 2A-2C illustrate signal CLK and signal CLK_D for different values of mul. Signal CLK_D is divided into phases, where each phase corresponds to two clock cycles of signal CLK_D. Decode logic block 140 is configured to control when each clock edge of signal CLK_D occurs. Phase 1 is the first two clock cycles of signal CLK_D that occur after mul has changed. Point A is the first positive edge of signal CLK_D that occurs in Phase 1. Point B is the first negative edge of signal CLK_D that occurs in each phase. Point C is the first positive edge of signal CLK_D that occurs after Point B in each phase. Point D is the first negative edge of signal CLK_D that occurs after Point C in each phase. Point E is the first positive edge of signal CLK_D that occurs after point D in each phase.

Decode logic block 140 is further configured to cause Point A to occur when pcount_d=1 and ncount_d=0. Decode logic block 140 is further configured to cause Points B, C, and D to occur according to the preselected reference values (ref). Decode logic block 140 is further configured to cause point E to occur when the next rising edge of signal CLK occurs after pcount_d=mul.

FIG. 3 is a tabular illustration of example reference values for an example table, in accordance with aspects of the present invention. Example ROM block 120 is configured to provide preselected reference values (ref) that are associated with mul. An example of ROM block 120 is configured to provide 3 reference pairs: rphl1, rplh2, and rphl2. Each reference pair comprises two reference values. Reference pair rphl1 comprises reference high-to-low positive 1 (refhlp1) and reference high-to-low negative 1 (refhln1). Reference pair rphl comprises reference low-to-high positive (reflhp) and reference low-to-high negative (reflhn). Reference pair rphl2 comprises reference high-to-low positive 2 (refhlp2) and reference high-to-low negative 2 (refhln2). Refhlp1 and refhln1 correspond to the values for pcount_d and ncount_d respectively at which point B has been preselected to occur for the current value of mul. Reflhp and reflhn corresponds to the values for pcount_d and ncount_d respectively at which point C has been preselected to occur for the current value of mul. Refhlp2 and refhln2 corresponds to the values for pcount_d and ncount_d respectively at which point D has been preselected to occur for the current value of mul.

The reference values (ref) for each value of mul may be preselected according to the duty cycle desired for signal CLK_D. Generally, it is desirable for the duty cycle to be as close to 50% as possible. The reference values (ref) shown in FIG. 3 are preselected such that the duty cycle of signal CLK_D is as close to 50% as possible and such that the high pulse is longer in duration than the low pulse when mul is odd. Alternatively, the reference values (ref) may also be preselected such that the duty cycle of signal CLK is as close to 50% as possible and such that the low pulse is longer in duration than the high pulse when mul is odd. As another alternative, other reference values (ref) may be preselected such that other duty cycles are attained for signal CLK_D.

Figure 4A:
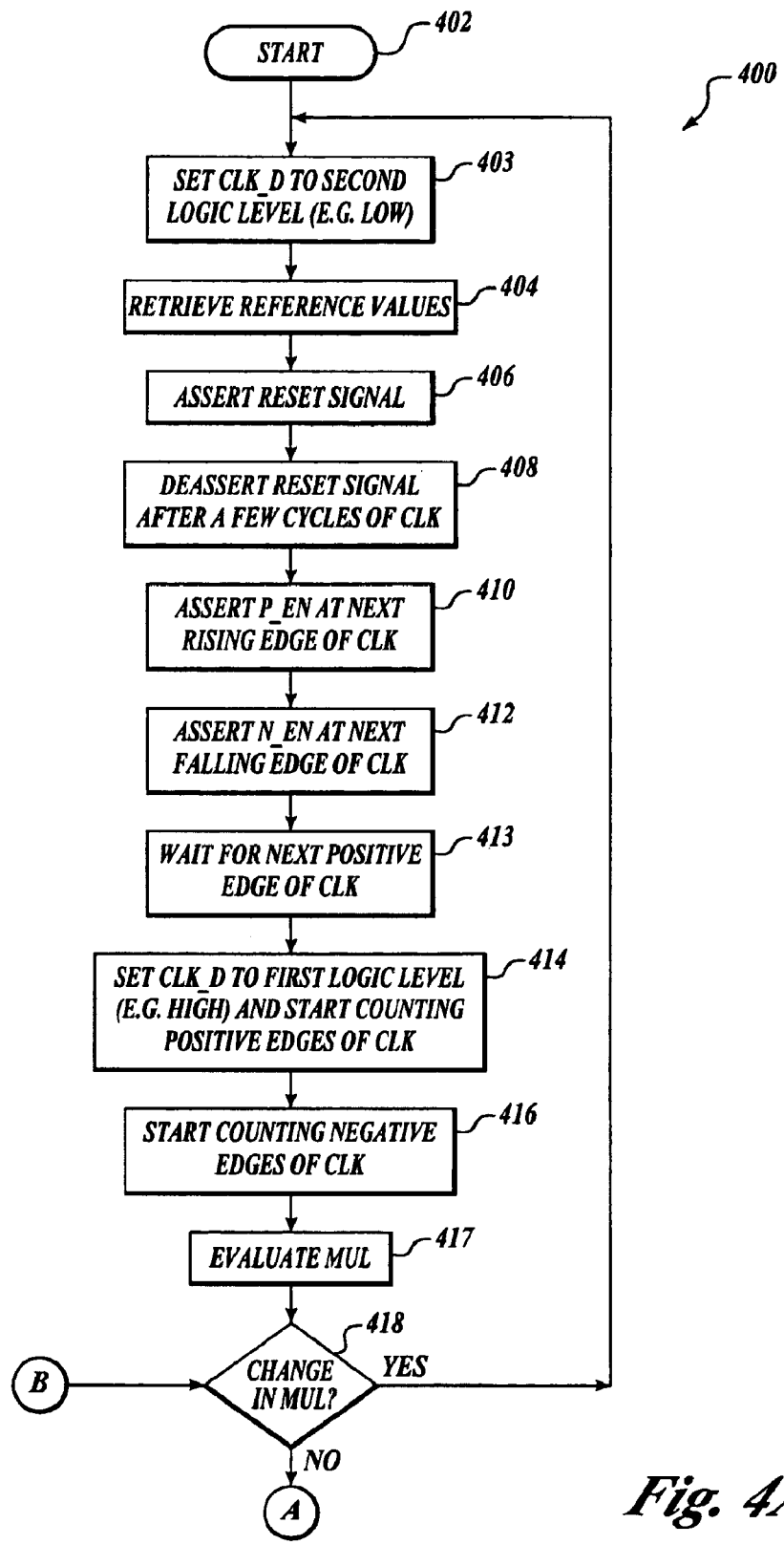
FIG. 4A and FIG. 4B illustrate an example embodiment of a process of fractional clock division, in accordance with aspects of the present invention.
Figure 4B:
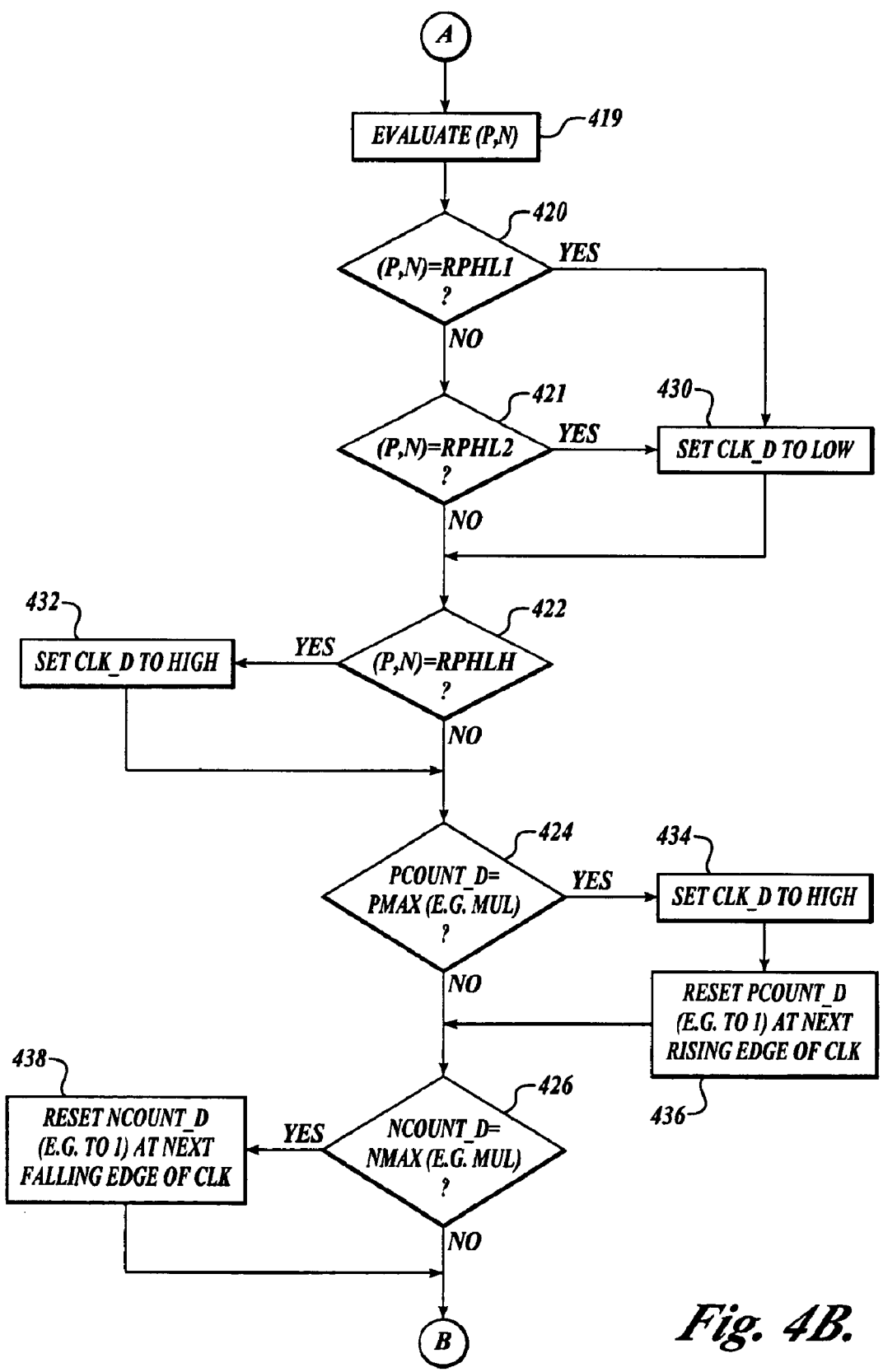

FIG. 4A and FIG. 4B illustrate an example embodiment of a process (400) of fractional clock division, in accordance with aspects of the present invention. After a start block (402), process 400 proceeds to block 403. At block 403, signal CLK_D is adjusted such that signal CLK_D corresponds to a second logical level (e.g. low). Processing then proceeds from block 403 to block 404. At block 404, reference values associated with the current value of mul are retrieved from a table. Alternatively, the reference value may be retrieved by another form of memory than a table (e.g. ROM, RAM, PLD, etc.) Processing then proceeds from block 404 to block 406. At block 406, a reset signal is asserted. Pcount_d and ncount_d are reset to an initial value (e.g. zero) while the reset signal is asserted. Processing then proceeds from block 406 to block 408. At block 408, the reset signal is deasserted after a few cycles of signal CLK. Processing then proceeds from block 408 to block 410.

At block 410, signal p_en is asserted when the next rising edge of signal CLK occurs after the reset signal is deasserted. Processing then proceeds from block 410 to block 412. At block 412, signal n_en is asserted on the next falling edge of signal CLK that occurs after signal p_en is asserted. Processing then proceeds from block 412 to block 413. At block 413, process 400 waits for the next positive edge of signal CLK. Processing then proceeds from block 413 to block 414. At block 414, positive edges of signal CLK are counted. Additionally, signal CLK_D is adjusted such that signal CLK_D corresponds to a first logical level (e.g. logic "1") when the first positive edge of signal CLK is counted. Processing then proceeds from block 414 to block 416. At block 416, negative edges of signal CLK are counted when the first negative edge of signal CLK occurs after counting of the positive edges of signal CLK begins. Processing then proceeds from block 416 to block 417.

At block 417, mul is evaluated. Processing then proceeds from block 417 to decision block 418. At decision block 418, a determination is made whether mul has changed. Processing proceeds from decision block 418 to block 403 when mul has changed. Alternatively, processing proceeds from decision block 418 to block 419 when mul is unchanged. At block 419, pcount_d and ncount_d are evaluated. At block 419, pcount_d and ncount_d are compared with the reference values (ref). Processing then proceeds from block 419 to decision block 420. At decision block 420, a determination is made whether pcount_d=refhlp1 and ncount_d= refhln1. Processing proceeds from decision block 420 to block 430 when pcount_d=refhlp1 and ncount_d=refhln 1. Alternatively, processing proceeds from decision block 420 to decision block 421 when either pcount_d≠refhlp1 or ncount_d≠refhln1. At block 430, signal CLK_D is adjusted such that signal CLK_D corresponds to a second logic level (e.g. low). Processing then proceeds from block 430 to block decision block 422. According to one example, decision blocks 420–422 are be performed simultaneously with combinational logic.

At decision block 421, a determination is made whether pcount_d=refhlp2 and ncount_d=refhlpn2. Processing proceeds from decision block 421 to block 430 when pcount_d=reflp2 and ncount_d=refhln2. Alternatively, processing proceeds from decision block 421 to decision block 422 when either pcount_d≠refhlp2 or ncount_d≠refhln2. At decision block 422, a determination is made whether pcount_d=reflhp and ncount_d=reflhn. Processing proceeds from decision block 422 to decision block 424 when either pcount_d≠reflhp or ncount_d≠reflhn. Alternatively, processing proceeds from decision block 422 to block 432 when pcount_d=reflhp and ncount_d=reflhn. Although decision blocks 420–422 are illustrated as separate blocks, each of the comparisons may be performed at the same At block 432, signal CLK_D is adjusted such that signal CLK_D corresponds to a first logic level (e.g. logic 1). Processing then proceeds from block 432 to block decision block 424. At decision block 424, a determination is made whether pcount_d has reached pmax (e.g. mul). Processing proceeds from decision block 424 to decision block 426 when pcount_d has not reached pmax. Alternatively, processing proceeds from decision block 424 to block 434 when pcount_d has reached pmax. At block 434, signal CLK_D is adjusted such that signal CLK_D corresponds to a first logic level (e.g. logic 1). Processing then proceeds from block 434 to block 436. At block 436, pcount_d is reset (e.g. to 1) at the next rising edge of signal CLK. Alternatively, pcount_d may be reset to 0 or some other value. Processing then proceeds from block 436 to decision block 426.

At decision block 426, a determination is made whether ncount_d has reached nmax (e.g. mul). Processing proceeds from decision block 426 to decision block 418 when ncount_d has not reached nmax. Alternatively, processing proceeds from decision block 426 to block 438 when ncount_d has reached nmax. At block 438, ncount_d is reset (e.g. to 1) at the next falling edge of signal CLK. Processing then proceeds from block 438 to decision block 418.

An example of process 400 was illustrated in which pcount_d is always greater than or equal to ncount_d. According to another example of process 400, ncount_d is always greater than or equal to pcount_d. According to this example, the order of signals n_en and p_en are reversed.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of clock division, the method comprising:

counting positive edges of an input clock signal to provide a positive edge count;

counting negative edges of the input clock signal to provide a negative edge count;

providing a set of reference values, wherein the set of reference values comprises a set of positive edge reference values and a set of negative edge reference values;

comparing the positive edge count with each value of the set of positive edge reference values;

comparing the negative edge count with each value of the set of negative edge reference values; and providing a divided clock signal in response to the comparisons such that the divided clock signal is related to the clock signal by an amount.

2. The method of claim 1, wherein providing the set of reference values comprises:

receiving a mul signal, wherein the mul signal has a mul value that corresponds to an integer; and selecting the set of reference values from a table based upon the mul value.

3. The method as in claim 1, further comprising reducing jitter in the divided clock signal.

4. The method of claim 1, further comprising:

receiving a mul signal, wherein the mul signal has a mul value that corresponds to an integer; and adjusting the set of reference values in response to a change in the mul value, wherein the set of reference values are associated with a particular mul value.

5. The method of claim 4, wherein the set of reference values comprises:

a pair of high-to-low reference values, wherein the pair of high-to-low reference values is associated with positive and negative edge counts that are preselected for a falling edge in the divided clock signal; and a pair of low-to-high references values, wherein the pair of low-to-high reference values is associated with positive and negative edge counts that are preselected for a rising edge in the divided clock signal.

6. The method of claim 1, wherein the set of reference values comprises a first reference value, a second reference value, a third reference value, a fourth reference value, a fifth reference value, and a sixth reference value, and wherein providing the divided clock signal comprises:

adjusting the divided clock signal such that the divided clock signal corresponds to a first logical level when a first condition is satisfied, wherein the first condition is satisfied when the positive edge count is equal to the first reference value and the negative edge count is equal to the second reference value;

adjusting the divided clock signal such that the divided clock signal corresponds to a second logical level when a second condition is satisfied, wherein the second condition is satisfied when the positive edge count is equal to the third reference value and the negative edge count is equal to the fourth reference value, and wherein the second logical level is an inverse of the first logical level; and adjusting the divided clock signal such that the divided clock signal corresponds to the first logical level when a third condition is satisfied, wherein the third condition is satisfied when the positive edge count is equal to the fifth reference value and the negative edge count is equal to the sixth reference value.

7. The method of claim 4, wherein the set of reference values comprises a first reference value, a second reference value, a third reference value, a fourth reference value, a fifth reference value, and a sixth reference value, and wherein providing the divided clock signal comprises:

adjusting the divided clock signal such that the divided clock signal corresponds to a first logical level when a first condition is satisfied, wherein the first condition is satisfied when the positive edge count is equal to the first reference value and the negative edge count is equal to the second reference value;

adjusting the divided clock signal such that the divided clock signal corresponds to a second logical level when a second condition is satisfied, wherein the second condition is satisfied when the positive edge count is equal to the third reference value and the negative edge count is equal to the fourth reference value, and wherein the second logical level is an inverse of the first logical level;

adjusting the divided clock signal such that the divided clock signal corresponds to the first logical level when a third condition is satisfied, wherein the third condition is satisfied when the positive edge count is equal to the fifth reference value and the negative edge count is equal to the sixth reference value;

adjusting the divided clock signal such that the divided clock signal corresponds to the second logical level when a fourth condition is satisfied, wherein the fourth condition is satisfied when the positive edge count is equal to one and the negative edge count is equal to zero; and adjusting the divided clock signal such that the divided clock signal corresponds to the second logical level when a fifth condition is satisfied, wherein the fifth condition is satisfied when the positive edge count is equal to one and the negative edge count has reached the mul value.

8. The method of claim 7, further comprising:

resetting the positive edge count when a positive edge of the input clock signal occurs after the positive edge count reaches the mul value; and resetting the negative edge count when a negative edge of the input clock signal occurs after the negative edge count reaches the mul value.

9. The method of claim 8, wherein the mul value corresponds to an odd integer greater than one such that the amount is fractional.

10. The method of claim 7, further comprising:

resetting the positive edge count to one when a positive edge of the input clock signal occurs after the positive edge count reaches the mul value; and resetting the negative edge count to one when a negative edge of the input clock signal occurs after the negative edge count reaches the mul value resetting the positive edge count to zero when the mul value changes;

disabling counting positive edges when the mul value changes;

resetting the negative edge count to zero when the mul value changes;

disabling counting negative edges when the mul value changes;

enabling counting positive edges at least one clock after disabling counting positive edges; and enabling counting negative edges after enabling counting positive edges such that the positive edge count is always greater than or equal to the negative edge count.

11. A system for clock division, the system comprising:

a first counter block that is configured to count positive edges of an input clock signal, and further configured to provide a positive edge count signal that has a positive edge count value that corresponds to a number of positive edges counted;

a second counter block that is configured to count negative edges of the input clock signal, and further configured to provide a negative edge count signal having a negative edge count value that corresponds to a number of negative edges counted;

a lookup block that is configured to provide a set of reference signals in response to a mul signal, wherein the mul signal has an associated mul value that corresponds to an integer; and a decode logic block that is configured to compare the positive edge count with each value of the set of positive edge reference values, compare the negative edge count with each value of the set of negative edge reference values, and provide a divided clock signal in response to the comparisons such that the divided clock signal is related to the clock signal by an amount.

12. The system of claim 11, further comprising a reset logic block, wherein the reset logic block is configured to:

assert a reset signal is response to a change in the mul value;

deassert the reset signal at least one clock after the reset signal is applied;

assert a negative edge count enable signal in response to a falling edge of the input clock signal when the reset signal is deasserted; and assert a positive edge count enable signal in response to a rising edge of the input clock signal when the negative edge count enable signal is asserted.

13. The system of claim 11, further comprising a reset logic block wherein the reset logic block is configured to:

assert a reset signal is response to a change in the mul value;

deassert the reset signal at least one clock after the reset signal is applied;

assert a positive edge count enable signal in response to a rising edge of the input clock signal when the reset signal is deasserted; and assert a negative edge count enable signal in response to a falling edge of the input clock signal when the positive edge count enable signal is asserted.

14. The system of claim 13, wherein the first counter block is configured to reset the positive edge count value to zero and stop counting when the reset signal is asserted, and further configured to resume counting when a positive edge of the input clock signal occurs after the positive edge count enable signal is asserted, and wherein the second counter block is configured to reset the negative edge count value to zero and stop counting when the reset signal is asserted, and further configured to resume counting when a negative edge of the input clock signal occurs after the negative edge count enable signal is asserted.

15. The system of claim 11, further comprising a jitter minimizing block comprising:
  a first flip-flop that is configured to provide a first clock signal in response to the divided clock signal, wherein the first flip-flop is triggered on rising edges of the input clock signal;
  a second flip-flop that is configured to provide a second clock signal in response to the divided clock signal, wherein the second flip-flop is triggered on falling edges of the input clock signal; and
  multiplexer that is configured to select the first clock signal as a jitter-minimized divided output clock signal when the input clock signal corresponds to a low logical level, and further configured to select the second clock signal as the jitter-minimized divided clock output signal when the input clock signal corresponds to a high logical level.

16. The system of claim 11, wherein a first of the set of reference signals has an associated first reference value, a second of the set of reference signals has an associated second reference value, a third of the set of reference signals has an associated third reference value, a fourth of the set of reference signals has an associated fourth reference value, a fifth of the set of reference signals has an associated fifth reference value, a sixth of the set of reference signals has an associated sixth reference value, and wherein the decode logic block is arranged to provide the divided clock signal by:
  adjusting the divided clock signal such that the divided clock signal corresponds to a first logical level when a first condition is satisfied, wherein the first condition is satisfied when the positive edge count value is equal to the first reference value and the negative edge count value is equal to the second reference value;
  adjusting the divided clock signal such that the divided clock signal corresponds to a second logical level when a second condition is satisfied, wherein the second condition is satisfied when the positive edge count value is equal to the third reference value and the negative edge count value is equal to the fourth reference value, and wherein the second logical level is an inverse of the first logical level; and
  adjusting the divided clock signal such that the divided clock signal corresponds to the first logical level when a third condition is satisfied, wherein the third condition is satisfied when the positive edge count value is equal to the fifth reference value and the negative edge count value is equal to the sixth reference value.

17. The system of claim 16, wherein the decode logic block is arranged to provide the divided clock signal by:
  adjusting the divided clock signal such that the divided clock signal corresponds to the second logical level when a fourth condition is satisfied, wherein the fourth condition is satisfied when the positive edge count value is equal to one and the negative edge count value is equal to zero; and
  adjusting the divided clock signal such that the divided clock signal corresponds to the second logical level when a fifth condition is satisfied, wherein the fifth condition is satisfied when the positive edge count value is equal to one and the negative edge count value has reached the mul value.

18. The system of claim 17, wherein the decode logic block is further arranged to provide the divided clock signal by:
  resetting the positive count to one when a positive edge of the input clock signal occurs after the positive count reaches the mul value; and
  resetting the negative count to one when a negative edge of the input clock signal occurs after the negative count reaches the mul value.

19. A system for clock division, the system comprising:
  a first means for counting that is configured to count positive edges of an input clock signal to provide a positive edge count;
  a second means for counting that is configured to count negative edges of the input clock signal to provide a negative edge count;
  a first means for providing that is configured to provide a set of reference values, wherein the set of reference values comprises a set of positive edge reference values and a set of negative edge reference values;
  a first means for comparing that is configured to compare the positive edge count with each value of the set of positive edge reference values;
  a second means for comparing that is configured to compare the negative edge count with each value of the set of negative edge reference values; and
  a second means for providing that is configured to provide a divided clock signal in response to the comparisons such that the divided clock signal is related to the clock signal by an amount.

20. The system of claim 19, wherein the means for providing is arranged to provide the set of reference signals in response to a mul signal, the mul signal has an associated mul value that corresponds to an integer, the set of reference values comprises a first reference value, a second reference value, a third reference value, a fourth reference value, a fifth reference value, and a sixth reference value, and wherein the second means for providing comprises:
  a first means for adjusting that is configured to adjust the divided clock signal such that the divided clock signal corresponds to a first logical level when a first condition is satisfied, wherein the first condition is satisfied when the positive edge count is equal to the first reference value and the negative edge count is equal to the second reference value;
  a second means for adjusting that is configured to adjust the divided clock signal such that the divided clock signal corresponds to a second logical level when a second condition is satisfied, wherein the second condition is satisfied when the positive edge count is equal to the third reference value and the negative edge count is equal to the fourth reference value, and wherein the second logical level is an inverse of the first logical level;
  a third means for adjusting that is configured to adjust the divided clock signal such that the divided clock signal corresponds to the first logical level when a third condition is satisfied, wherein the third condition is satisfied when the positive edge count is equal to the fifth reference value and the negative edge count is equal to the sixth reference value;
  a fourth means for adjusting that is configured to adjust the divided clock signal such that the divided clock signal corresponds to the second logical level when a fourth condition is satisfied, wherein the fourth condition is satisfied when the positive edge count is equal to one and the negative edge count is equal to zero; and a fifth means for adjusting that is configured to adjust the divided clock signal such that the divided clock signal corresponds to the second logical level when a fifth condition is satisfied, wherein the fifth condition is satisfied when the positive edge count is equal to one and the negative edge count has reached the mul value.

* * * * *

UNITED STATES PATENT AND TRADEMARK OFFICE
CERTIFICATE OF CORRECTION

PATENT NO. : 6,861,881 B1
DATED : March 1, 2005
INVENTOR(S) : Karthik R. Neravetla et al.

It is certified that error appears in the above-identified patent and that said Letters Patent is hereby corrected as shown below:

Column 5,
Line 19, delete "ncount_d=refhln 1" and insert -- ncount_d=refhln1 --.

Column 9,
Line 18, insert -- a -- before "multiplexer".

Signed and Sealed this

Second Day of August, 2005

JON W. DUDAS
*Director of the United States Patent and Trademark Office*